US012581640B2

(12) United States Patent
Huang

(10) Patent No.: US 12,581,640 B2
(45) Date of Patent: Mar. 17, 2026

(54) SEMICONDUCTOR STRUCTURE AND MANUFACTURING METHOD THEREFOR

(71) Applicant: Changxin Memory Technologies, Inc., Hefei (CN)

(72) Inventor: Meng Huang, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 489 days.

(21) Appl. No.: 18/093,930

(22) Filed: Jan. 6, 2023

(65) Prior Publication Data

US 2023/0422477 A1     Dec. 28, 2023

Related U.S. Application Data

(63) Continuation of application No. PCT/CN2022/103201, filed on Jun. 30, 2022.

(30) Foreign Application Priority Data

Jun. 22, 2022     (CN) .......................... 202210714330.1

(51) Int. Cl.
H10B 12/00          (2023.01)
(52) U.S. Cl.
CPC ........... H10B 12/312 (2023.02); H10B 12/03 (2023.02); H10B 12/05 (2023.02); H10B 12/485 (2023.02); H10B 12/488 (2023.02)
(58) Field of Classification Search
CPC ...... H10B 12/312; H10B 12/03; H10B 12/05; H10B 12/485; H10B 12/488
See application file for complete search history.

(56) References Cited

U.S. PATENT DOCUMENTS 6,624,018 B1     9/2003  Yu et al.
9,716,137 B1     7/2017  Hu et al.
(Continued)

FOREIGN PATENT DOCUMENTS

CN          114023703 A      2/2022
CN          114373758 A      4/2022
(Continued)

OTHER PUBLICATIONS

PCT International Search Report and the Written Opinion mailed Dec. 19, 2022, issued in related International Application No. PCT/CN2022/103201, with English translation (19 pages).
(Continued)

*Primary Examiner* — Jarrett J Stark
(74) *Attorney, Agent, or Firm* — Sheppard Mullin Richter & Hampton LLP

(57) ABSTRACT

A semiconductor structure includes: a bit line, a transistor structure, and a capacitor structure arranged in sequence in a first direction, the capacitor structure extending in the first direction, both the transistor structure and the capacitor structure including a portion of a semiconductor layer, and the semiconductor layer extending in the first direction; and a bit line contact layer on an end surface of the semiconductor layer that is away from the capacitor structure, the bit line contact layer and the semiconductor layer including the same semiconductor material, and the bit line covering an end surface of the bit line contact layer that is away from the semiconductor layer and covering at least a portion of a sidewall of the bit line contact layer that extends in the first direction.

18 Claims, 6 Drawing Sheets

(56)　　　　References Cited

U.S. PATENT DOCUMENTS

| | | | |
|---|---|---|---|
| 9,853,031 | B1 * | 12/2017 | Cho ........................ H10D 64/68 |
| 10,204,910 | B2 * | 2/2019 | Kim .................... H10B 12/053 |
| 10,615,164 | B2 * | 4/2020 | Kim ....................... H10B 12/34 |
| 11,004,854 | B2 * | 5/2021 | Nam ................. H10B 12/0335 |
| 12,080,758 | B2 * | 9/2024 | Zhang ................ H01L 21/0334 |
| 2003/0001290 | A1 | 1/2003 | Nitayama et al. |
| 2015/0035022 | A1 * | 2/2015 | Chung ................ H10D 64/027 |
| | | | 438/424 |
| 2020/0111793 | A1 | 4/2020 | Kim et al. |
| 2021/0028184 | A1 | 1/2021 | Kim |
| 2021/0375875 | A1 | 12/2021 | Brewer et al. |
| 2022/0005810 | A1 | 1/2022 | Kang et al. |
| 2022/0013524 | A1 | 1/2022 | Ryu et al. |
| 2022/0045064 | A1 | 2/2022 | Jung et al. |
| 2022/0102394 | A1 | 3/2022 | Liu et al. |
| 2022/0122980 | A1 | 4/2022 | Han et al. |
| 2022/0173106 | A1 * | 6/2022 | Choi ...................... H10B 12/03 |
| 2023/0309290 | A1 | 9/2023 | Choi |
| 2023/0328964 | A1 * | 10/2023 | Lee ...................... H10B 12/315 |
| | | | 257/296 |

FOREIGN PATENT DOCUMENTS

| | | | |
|---|---|---|---|
| TW | | 201644079 A | 12/2016 |
| TW | | 202125771 A | 7/2021 |

OTHER PUBLICATIONS

Search Report dated Jan. 30, 2024, issued in related Taiwan Application No. 112120356, with English machine translation (2 pages).
Extended European Search Report dated May 12, 2025, issued in related European Patent Application No. 22947479.6 (8 pages).

* cited by examiner

SEMICONDUCTOR STRUCTURE AND MANUFACTURING METHOD THEREFOR

CROSS-REFERENCE TO RELATED APPLICATIONS

The present application is a continuation application of International Patent Application No. PCT/CN2022/103201, filed on Jun. 30, 2022, which claims priority to Chinese Patent Application No. 202210714330.1, entitled "SEMI-CONDUCTOR STRUCTURE AND MANUFACTURING METHOD THEREFOR", filed on Jun. 22, 2022. The above applications are incorporated herein by reference in their entirety.

TECHNICAL FIELD

Embodiments of the present disclosure relate to the field of semiconductor technologies, and in particular, to a semiconductor structure and a manufacturing method therefor.

BACKGROUND

Integration density of dynamic memories has gradually going up. In addition to studying of how to dispose a transistor in a dynamic memory array and how to reduce the size of single functional components in the dynamic memory array, the electrical performance of small-sized functional components needs to be improved.

Because the contact area between a transistor structure in the dynamic memory and a bit line is relatively small, and it is difficult to improve the contact surface, the contact resistance between the transistor structure and the bit line is relatively large.

SUMMARY

Embodiments of the present disclosure provides a semiconductor structure and a manufacturing method therefor, which reduces contact resistance between a transistor structure and a bit line.

According to some embodiments of the present disclosure, one aspect of the present disclosure provides a semiconductor structure, including: a bit line, a transistor structure, and a capacitor structure arranged in sequence in a first direction, the capacitor structure extending in the first direction, both the transistor structure and the capacitor structure including a portion of a semiconductor layer, and the semiconductor layer extending in the first direction; and a bit line contact layer on an end surface of the semiconductor layer that is away from the capacitor structure, the bit line contact layer and the semiconductor layer including the same semiconductor material, and the bit line covering an end surface of the bit line contact layer that is away from the semiconductor layer and covering at least a portion of a sidewall of the bit line contact layer that extends in the first direction.

According to some embodiments of the present disclosure, another aspect of the present disclosure further provides a semiconductor structure manufacturing method, including: forming a transistor structure and a capacitor structure arranged in a first direction, the capacitor structure extending in the first direction, both the transistor structure and the capacitor structure including a portion of a semiconductor layer, and the semiconductor layer extending in the first direction; forming a bit line contact layer, the bit line contact layer being located on an end surface of the semiconductor layer that is away from the capacitor structure, and the bit line contact layer and the semiconductor layer including the same semiconductor material; and forming a bit line, the bit line covering an end surface of the bit line contact layer that is away from the semiconductor layer and covering at least a portion of a sidewall of the bit line contact layer that extends in the first direction.

BRIEF DESCRIPTION OF DRAWINGS

One or more embodiments are illustrated by the figures in the accompanying drawings corresponding thereto. These example descriptions do not constitute a limitation on the embodiments. Elements having the same reference numerals in the accompanying drawings are denoted as similar elements, unless otherwise specifically stated, the figures in the accompanying drawings do not constitute a limitation on scale. To describe the technical solutions in the embodiments of the present disclosure or in the conventional technologies more clearly, the following briefly describes the accompanying drawings needed for describing the embodiments. Clearly, the accompanying drawings in the following description show merely some embodiments of the present disclosure, and a person of ordinary skill in the art can still derive other drawings from these accompanying drawings without creative efforts.

DESCRIPTION OF EMBODIMENTS

Embodiments of the present disclosure provide a semiconductor structure and a manufacturing method therefor. A bit line, a transistor structure, and a capacitor structure are all arranged in a first direction, and both the transistor structure and the capacitor structure include a portion of a semiconductor layer, so as to construct a new layout method among the bit line, the transistor structure, and the capacitor structure. In addition, on one hand, there is a bit line contact layer between the bit line and an end surface of the semiconductor layer that is away from the capacitor structure. It can be understood that the end surface of the semiconductor layer that is away from the capacitor structure can be an end surface of the source region or the drain region in the transistor structure. The bit line covers an end surface of the bit line contact layer that is away from the semiconductor layer and covers at least a portion of a sidewall of the bit line contact layer that extends in the first direction. As such, the contact area between the bit line contact layer and the bit line is increased, and contact resistance between the bit line and the bit line contact layer is reduced, so as to further reduce contact resistance between the bit line and the transistor structure. On the other hand, the bit line contact layer and the semiconductor layer include the same semiconductor material, which reduces interface defects between the bit line contact layer and the semiconductor layer, so as to improve contact performance between the bit line contact layer and the semiconductor layer, thereby further reducing contact resistance between the bit line and the transistor structure.

The following describes the embodiments of the present disclosure in detail with reference to the accompanying drawings. However, a person of ordinary skill in the art can understand that in the embodiments of the present disclosure, many technical details are proposed to better understand the embodiments of the present disclosure. However, even without these technical details and various changes and modifications based on the following embodiments, the technical solutions required for protection in the embodiments of the present disclosure can be implemented.

Figure 1:
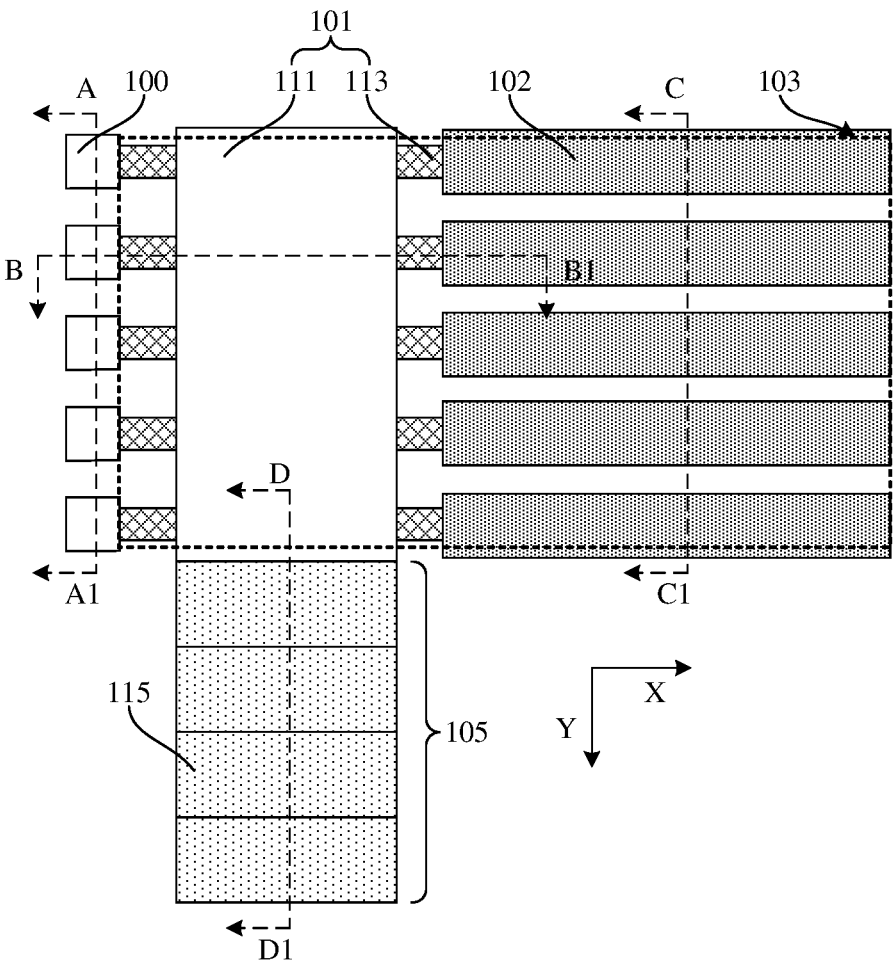
FIG. 1 is a schematic diagram illustrating a partial top view of a semiconductor structure according to an embodiment of the present disclosure.
Figure 2:
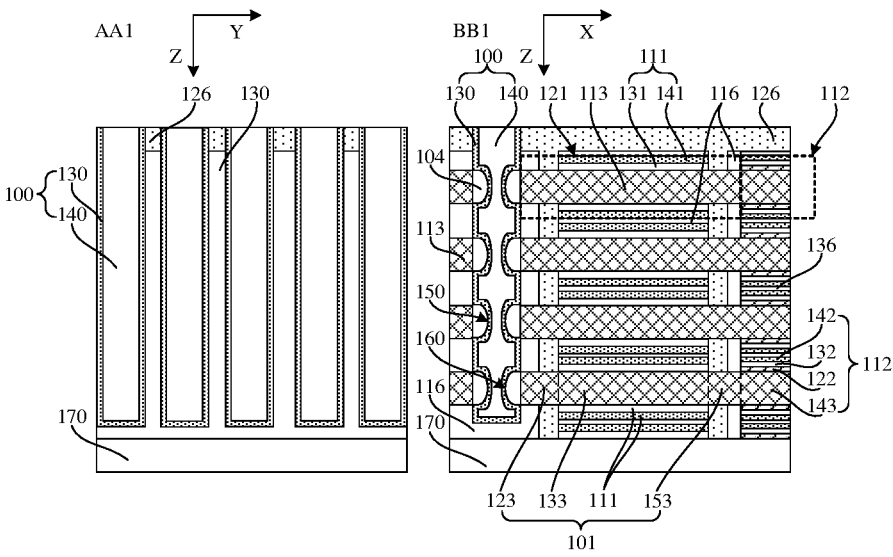
FIG. 2 is a schematic partial cross-sectional diagram illustrating the semiconductor structure shown in FIG. 1 in a first cross-sectional direction AA1 and a second cross-sectional direction BB1.
Figure 3:
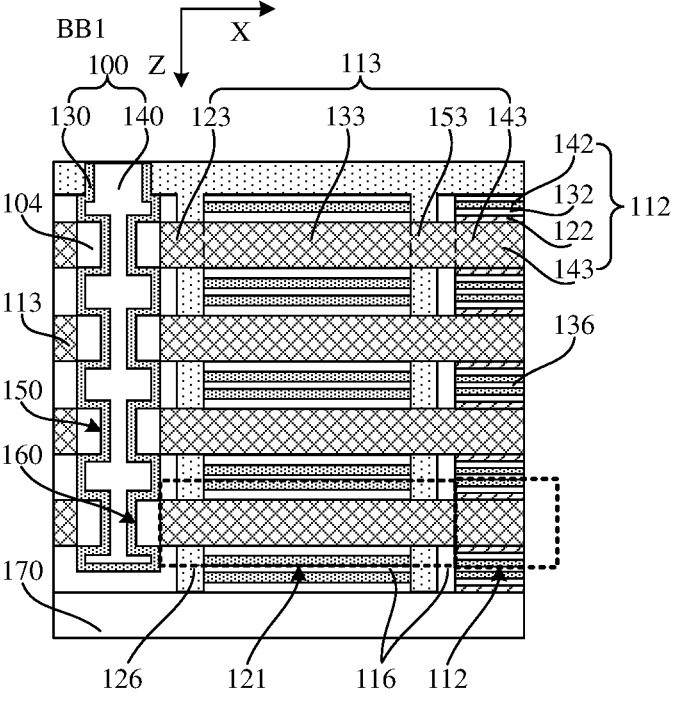
FIG. 3 is another schematic partial cross-sectional diagram illustrating the semiconductor structure shown in FIG. 1 in a second cross-sectional direction BB1.
Figure 4:
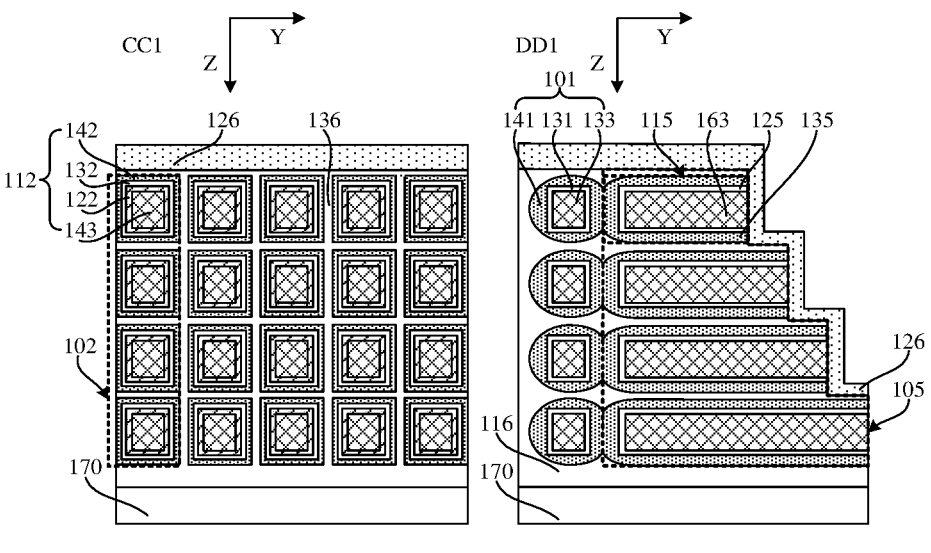
FIG. 4 is a schematic partial cross-sectional diagram illustrating the semiconductor structure shown in FIG. 1 in a third cross-sectional direction CC1 and a fourth cross-sectional direction DD1.
Figure 5:
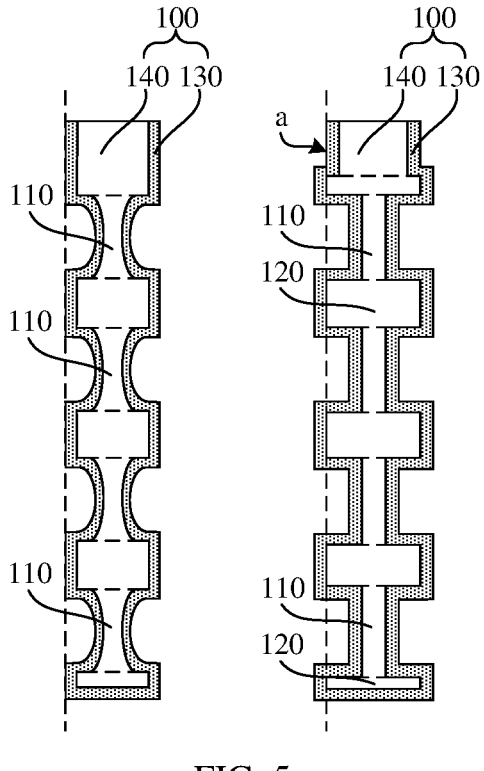
FIG. 5 is a partially enlarged schematic diagram illustrating a bit line in a semiconductor structure shown in FIG. 2 and FIG. 3.

An embodiment of the present disclosure provides a semiconductor structure. The following describes in detail the semiconductor structure provided in this embodiment of the present disclosure with reference to the accompanying drawings. FIG. 1 is a schematic diagram illustrating a partial top view of a semiconductor structure according to an embodiment of the present disclosure. FIG. 2 is a schematic partial cross-sectional diagram illustrating the semiconductor structure shown in FIG. 1 in a first cross-sectional direction AA1 and a second cross-sectional direction BB1. FIG. 3 is another schematic partial cross-sectional diagram illustrating the semiconductor structure shown in FIG. 1 in the second cross-sectional direction BB1. FIG. 4 is a schematic partial cross-sectional diagram illustrating the semiconductor structure shown in FIG. 1 in a third cross-sectional direction CC1 and a fourth cross-sectional direction DD1. FIG. 5 is a partially enlarged schematic diagram illustrating a bit line in a semiconductor structure shown in FIG. 2 and FIG. 3.

Referring to FIG. 1 to FIG. 5, the semiconductor structure includes a bit line 100, a transistor structure 101, and a capacitor structure 102 arranged in sequence in a first direction X, the capacitor structure 102 extending in the first direction X, both the transistor structure 101 and the capacitor structure 102 including a portion of a semiconductor layer 103, and the semiconductor layer 103 extending in the first direction X; and a bit line contact layer 104 on an end surface of the semiconductor layer 103 that is away from the capacitor structure 102, the bit line contact layer 104 and the semiconductor layer 103 including the same semiconductor material, and the bit line 100 covering an end surface of the bit line contact layer 104 that is away from the semiconductor layer 103 and covering at least a portion of a sidewall of the bit line contact layer 104 that extends in the first direction X.

It can be understood that the end surface of the semiconductor layer 103 that is away from the capacitor structure 102 can be an end surface of a source region or a drain region in the transistor structure 101. Therefore, the bit line 100 covers the end surface of the bit line contact layer 104 that is away from the semiconductor layer 103, that is, the bit line 100 covers the end surface of the source region or the drain region in the transistor structure 101. Therefore, the bit line contact layer 104 is located on the end surface of the semiconductor layer 103 that is away from the capacitor structure 102, and when the bit line 100 covers the end surface of the source region or the drain region in the transistor structure 101 and the portion of the sidewall of the cover bit line contact layer 104 that extends along the first direction X, the bit line 100 is in contact with a plurality of end surfaces of the bit line contact layer 104, which increases the contact area between the bit line contact layer 104 and the bit line 100, thereby reducing contact resistance between the bit line 100 and the bit line contact layer 104, and further reducing contact resistance between the bit line 100 and the transistor structure 101. In addition, the bit line contact layer 104 and the semiconductor layer 103 include the same semiconductor material, which reduces interface defects between the bit line contact layer 104 and the semiconductor layer 103, so as to improve contact performance between the bit line contact layer 104 and the semiconductor layer 103, thereby further reducing contact resistance between the bit line 100 and the transistor structure 101, and therefore, improving electrical performance of a semiconductor structure.

In some embodiments, a semiconductor element can include at least one of silicon, carbon, germanium, arsenic, gallium, and indium. In an example, both the bit line contact layer 104 and the semiconductor layer 103 can include silicon.

In addition, the bit line 100, the transistor structure 101, and the capacitor structure 102 are all arranged in the first direction X, and both the transistor structure 101 and the capacitor structure 102 include a portion of the semiconductor layer 103. It can be understood that the semiconductor layer 103 is commonly used in the transistor structure 101 and the capacitor structure 102, and the semiconductor layer 103 in the transistor structure 101 is electrically connected to the semiconductor layer 103 in the capacitor structure 102, so as to implement electrical connection between the transistor structure 101 and the capacitor structure 102. As such, a new layout method among the bit line 100, the transistor structure 101, and the capacitor structure 102 is constructed.

The following describes the bit line 100 in detail with reference to FIG. 2, FIG. 3, and FIG. 5.

In some embodiments, referring to FIG. 2 and FIG. 5, the bit line 100 can have at least one recessed region 110 recessing inward the bit line 100. It can be understood that the recessed region 110 is configured to accommodate at least a portion of the bit line contact layer 104, so a surface area of a sidewall of the bit line 100 can be increased by using the recessed region 110. The bit line 100 covers the end surface of the source region or the drain region in the transistor structure 101 and at least a portion of the sidewall of the bit line contact layer 104 that extends along the first direction X, thereby facilitating an increase of the contact area between the bit line 100 and the bit line contact layer 104. This reduces contact resistance between the bit line 100 and the bit line contact layer 104.

In an example, still referring to FIG. 2 and FIG. 5, the bit line 100 has first side 150 and second side 160 opposite to each other in the first direction X. A top surface of a groove formed by the first side 150 of the recessed region 110 can be flush with a top surface of the first side 150 that is the farthest from the bit line 100.

It should be noted that, in FIG. 2 and FIG. 5, for example, one bit line 100 includes four recessed regions 110 that are spaced apart from each other, and each recessed region 110 is recessed to the inside of the bit line 100 along both sides in the first direction X. In practice, a quantity of spaced apart recessed regions 110 included in one bit line 100 is not limited, and for a single recessed region 110, only one of two sides thereof in the first direction X can be recessed to the inside of the bit line 100.

In some other embodiments, referring to FIG. 3 and FIG. 5, the bit line 100 can further have at least one raised region 120 raising in a direction away from the inside of the bit line 100 on the basis of the bit line 100 having at least one recessed region 110 recessing inward the bit line 100. The bit line 100 has a reference surface a, and a top surface of the raised region 120 and a bottom surface of the recessed region 110 are located on both sides of the reference surface a in the first direction X. It can be understood that the recessed region 110 and the raised region 120 jointly form a groove configured to accommodate at least a portion of the bit line contact layer 104, so the surface area of the sidewall of the bit line 100 can be increased by using the recessed region 110 and the raised region 120. The bit line 100 covers the end surface of the source region or the drain region in the transistor structure 101 and at least a portion of the sidewall of the bit line contact layer 104 that extends along the first direction X, thereby increasing the contact area between the bit line 100 and the bit line contact layer 104, to reduce contact resistance between the bit line 100 and the bit line contact layer 104.

In an example, still referring to FIG. 3 and FIG. 5, the bit line 100 has first and second sides 150 and 160 opposite to each other in the first direction X, a bottom surface of a groove formed by the first side 150 of the recessed region 110 is located on one side of the reference surface a, and the top surface of the second side 160 of the raised region 120 that is away from the inside of the bit line 100 is located on the other side of the reference surface.

It should be noted that, in FIG. 3 and FIG. 5, for example, one bit line 100 includes four spaced recessed regions 110 and four spaced raised regions 120, the recessed regions 110 and the raised regions 120 are contacted and connected, and each recessed region 110 is recessed to the inside of the bit line 100 along both sides in the first direction X, and each raised region 120 is raised to the direction away from the inside of the bit line 100 along both sides in the first direction X. In practice, the quantity of spaced recessed regions 110 and the quantity of spaced raised regions 120 included in one bit line 100 are not limited. For a single recessed region 110, only one of two sides thereof in the first direction X can be recessed to the inside of the bit line 100; and for a single raised region 120, only one of two sides thereof in the first direction X can be raised to the direction away from the inside of the bit line 100.

In some embodiments, the material of the bit line contact layer 104 can be a metal semiconductor material.

It can be understood that the metal semiconductor material has a relatively small resistivity compared with an unmetallized semiconductor material. Therefore, compared with the semiconductor layer 103, the resistivity of the bit line contact layer 104 is smaller, which reduces the contact resistance between the semiconductor layer 103 and the bit line contact layer 104, and reduces the contact resistance between the bit line contact layer 104 and the bit line 100, so as to reduce the contact resistance between the bit line 100 and the semiconductor layer 103, thereby further improving the electrical performance of the semiconductor structure.

In some embodiments, for example, the semiconductor material is silicon, and the metal semiconductor material can include at least one of cobalt silicide, nickel silicide, molybdenum silicide, titanium silicide, tungsten silicide, tantalum silicide, or platinum silicide.

In the above two embodiments, referring to FIG. 5, the bit line 100 includes a diffusion barrier layer 130 and a conductive layer 140 that are sequentially stacked. The diffusion barrier layer 130 prevents diffusion of a conductive material in the conductive layer 140 to the bit line contact layer 104, so as to ensure good conductive performance of the bit line contact layer 104. In an example, the material of the diffusion barrier layer 130 can be titanium nitride, and the material of the conductive layer 140 can be at least one of a conductive material such as polysilicon, tungsten, or copper.

In some embodiments, referring to FIG. 1, a plurality of bit lines 100, a plurality of transistor structures 101, and a plurality of capacitor structures 102 are arranged in a second direction Y. The bit lines 100 are in a one-to-one correspondence with the transistor structures 101. The transistor structures 101 are in a one-to-one correspondence with the capacitor structures 102. The plurality of transistor structures 101 include a partial gate structure 111, the gate structure 111 extends in the second direction Y. And the first direction X and the second direction Y are intersected.

It can be understood that the gate structure 111 is configured to control the transistor structure 101, and the plurality of transistor structures 101 include a partial gate structure 111. In this case, one gate structure 111 can control a plurality of transistor structures 101 arranged in the second direction Y. As such, integration density of the transistor structures 101, the bit lines 100, and the capacitor structures 102 in the semiconductor structure is improved, and the complexity of controlling a plurality of components in the semiconductor structure is reduced.

It should be noted that, in FIG. 1 to FIG. 4, for example, the semiconductor structure includes five bit lines 100 arranged in the second direction Y. In practice, the quantity of bit lines 100 included in the semiconductor structure is not limited, provided that the quantity of bit lines 100 is equal to the quantity of transistor structures 101.

In some embodiments, referring to FIG. 1 to FIG. 4, the transistor structure 101 can include a plurality of sub-transistor structures 121 arranged at intervals in a third direction Z. The capacitor structure 102 includes a plurality of sub-capacitor structures 112 arranged at intervals in the third direction Z. The semiconductor layer 103 includes a plurality of sub-semiconductor layers 113 arranged at intervals in the third direction Z. The sub-transistor structures 121 are in a one-to-one correspondence with the sub-capacitor structures 112, and all the sub-transistor structures 121 and the corresponding sub-capacitor structures 112 include a portion of the sub-semiconductor layer 113. In addition, the bit line 100 extends in the third direction Z. The bit line 100 is electrically connected to a plurality of sub-transistor structures 121 in the same transistor structure 101, and the sub-transistor structures 121 are in a one-to-one correspondence with the bit line contact layers 104.

It can be understood that a plurality of sub-transistor structures 121 and a plurality of sub-capacitor structures 112 can be arranged along the third direction Z. One sub-transistor structure 121 can be independently used as one transistor unit, and one sub-capacitor structure 112 can be independently used as one capacitor unit. One transistor unit and one capacitor unit can form one storage unit. As such, the layout density of storage units in the semiconductor structure can be increased by stacking the sub-transistor structures 121 and the sub-capacitor structures 112 along the third direction Z, thereby improving integration density of the semiconductor structure.

It should be noted that, in FIG. 2 to FIG. 4, for example, four sub-transistor structures 121 in the transistor structure 101 are stacked in the third direction Z. In practice, the quantity of sub-transistor structures 121 in the transistor structure 101 that are stacked in the third direction Z is not limited, and can be designed according to an actual requirement, provided that the quantity of sub-transistor structures 121, the quantity of sub-capacitor structures 112, and the quantity of sub-semiconductor layers 113 are consistent.

In an example, a transistor structure 101 can have one sub-transistor structure 121 stacked in the third direction Z. In this case, the sub-transistor structure 121 is the transistor structure 101; a capacitor structure 102 has one sub-capacitor structure 112 stacked in the third direction Z, and the sub-capacitor structure 112 is the capacitor structure 102; and a semiconductor layer 103 has one sub-semiconductor layer 113 stacked in the third direction Z, and the sub-semiconductor layer 113 is the semiconductor layer 103.

In some embodiments, still referring to FIG. 2 to FIG. 4, in the first direction X, the bit line 100 can include the first side 150 and the second side 160 opposite to each other, and the first side 150 and the second side 160 are electrically connected to different transistor structures 101. As such, the two transistor structures 101 share one bit line 100, which further improves integration density of the transistor structures 101, the bit lines 100, and the capacitor structures 102 in the semiconductor structure, and further reduces the complexity of controlling a plurality of components in the semiconductor structure.

In some embodiments, still referring to FIG. 2 to FIG. 4, in the first direction X, the sub-semiconductor layer 113 includes a first region 123, a second region 133, and a third region 143, and an end surface of the first region 123 that is away from the second region 133 is in contact with the bit line contact layer 104. The sub-transistor structure 121 includes the first region 123, the second region 133, and a gate structure 111. The gate structure 111 surrounds a sidewall of the second region 133 that extends in the first direction X. The sub-capacitor structure 112 includes the third region 143, and a sub-lower electrode layer 122, a capacitor dielectric layer 132, and an upper electrode layer 142 that are sequentially stacked. The sub-lower electrode layer 122 surrounds a sidewall of the third region 143 that extends in the first direction X.

In some embodiments, referring to FIG. 2 and FIG. 3, the gate structure 111 can include a gate dielectric layer 131 and a gate conductive layer 141. The gate dielectric layer 131 surrounds the sidewall of the second region 133 that extends in the first direction X. The gate conductive layer 141 surrounds the sidewall of the gate dielectric layer 131 that extends in the first direction X away from the second region 133, and the gate conductive layer 141 extends in the second direction Y, so one gate conductive layer 141 is contacted with and connected to gate dielectric layers 131 in a plurality of sub-transistor structures 121 arranged at intervals in the second direction Y. It can be understood that the material of the gate conductive layer 141 can be at least one of a conductive material such as titanium nitride, tungsten, or silver, and the material of the gate dielectric layer 131 can be at least one of an insulating material such as silicon oxide, silicon nitride, or silicon oxynitride.

In some embodiments, still referring to FIG. 2 and FIG. 3, the semiconductor layer 103 in the transistor structure 101 successively includes the first region 123, the second region 133, and a fourth region 153 in the first direction X. The first region 123 can be one of a source or a drain of the transistor structure 101, the fourth region 153 can be the other of the source or drain, the second region 133 can be a channel region, and the fourth region 153 is contacted with and connected to the third region 143 to implement electrical connection between the sub-transistor structure 121 and the sub-capacitor structure 112.

In some embodiments, the lower electrode layer in the sub-capacitor structure 112 includes the third region 143 and the sub-lower electrode layer 122. The sub-lower electrode layer 122 surrounds at least a portion of the sidewall of the third region 143 that extends in the first direction X. The capacitor dielectric layer 132 surrounds the sidewall of the sub-lower electrode layer 122 that is away from the third region 143 and extends in the first direction X. The upper electrode layer 142 surrounds the sidewall of the capacitor dielectric layer 132 that is away from the sub-lower electrode layer 122 and extends in the first direction X.

In some embodiments, the upper electrode layer 142 can include a diffusion barrier layer (not shown) and a sub-upper electrode layer (not shown) that are sequentially stacked. The diffusion barrier layer surrounds the sidewall of the capacitor dielectric layer 132 that is away from the sub-lower electrode layer 122 and extends in the first direction X. The sub-upper electrode layer surrounds a sidewall of the diffusion barrier layer that is away from the capacitor dielectric layer 132 and extends in the first direction X. The diffusion barrier layer blocks the diffusion of a conductive material in the sub-upper electrode layer to the capacitor dielectric layer 132, so as to ensure good insulation performance of the capacitor dielectric layer 132 and ensure good conductive performance of the sub-upper electrode layer. In an example, the material of the diffusion barrier layer can be titanium nitride, the material of the sub-upper electrode layer and a material of the sub-lower electrode layer 122 can be at least one of a conductive material such as polysilicon, titanium nitride, or tungsten, and the material of the capacitor dielectric layer 132 can be a dielectric material of a high dielectric constant such as strontium titanate, hafnium oxide, chromium oxide, or zirconium oxide.

In some embodiments, referring to FIG. 1 and FIG. 4, in the second direction Y, some of the sub-transistor structures 121 in different transistor structures 101 include a partial region of the same gate structure 111. The gate structure 111 extends in the second direction Y. A quantity of the sub-transistor structures 121 in the same transistor structure 101 is the same as the quantity of the gate structures 111, and any two of the first direction X, the second direction Y, and the third direction Z are intersected. The semiconductor structure further includes a word line step structure 105, electrically connected to the plurality of gate structures 111.

It can be understood that second regions 133 in a plurality of sub-transistor structures 121 arranged at intervals along the second direction Y at the same layer are in contact with the same gate structure 111. The second regions 133 in sub-transistor structures 121 at different layers in the same transistor structure 101 are in contact with different gate structures 111. As such, the word line step structure 105 is electrically connected to the plurality of gate structures 111. It is advantageous to implement independent control on different gate structures 111 by using the word line step structure 105.

In an example, any two of the first direction X, the second direction Y, and the third direction Z can be perpendicular to each other.

In some embodiments, referring to FIG. 1 and FIG. 4, the word line step structure 105 can include a plurality of step structures 115 arranged at intervals in the third direction Z. The step structures 115 extend in the second direction Y. The lengths of the step structures 115 in the second direction Y are different, and the step structures 115 are in a one-to-one correspondence with the gate structures 111.

The gate structures 111 are connected to the step structures 115 in a one-to-one correspondence method, and lengths of the step structures 115 in the second direction Y are different. As such, different gate structures 111 can be controlled by using different step structures 115, so as to implement independence between different sub-transistor structures 121 in the same transistor structure 101.

It should be noted that, in FIG. 2 to FIG. 4, for example, the gate structure 111 extends along the second direction Y. In practice, an extension direction of the gate structure 111 can be designed according to an actual requirement.

In some embodiments, referring to FIG. 2 to FIG. 4, the semiconductor structure can further include a substrate 170, located below the bit line 100, the transistor structure 101, the capacitor structure 102, and the word line step structure 105 in the third direction Z, and configured to serve as a support base for the bit line 100, the transistor structure 101, the capacitor structure 102, and the word line step structure 105.

In some embodiments, in a direction in which the sub-transistor structure 121 points to the substrate 170, lengths of the step structures 115 in the second direction Y can be sequentially increased.

In another embodiment, the step structure 115 can extend in the first direction X, and lengths of the step structures 115 in the first direction X are different. As such, both an extension direction of the word line step structure 105 and an extension direction of the capacitor structure 102 are the first direction X. Generally, the capacitor structure 102 is required to have a large capacitance, such that the capacitor structure 102 occupies a relatively large layout length in the first direction X. Therefore, a layout length of the semiconductor structure in the first direction X is generally determined by the layout length of the capacitor structure 102 in the first direction X. Therefore, the word line step structure 105 extends along the first direction X, which increases the interface region of the word line step structure 105 and the capacitor structure 102, to reduce a layout width of the word line step structure 105 in the second direction Y. The word line step structure 105 can be arranged as much as possible in the first direction X, thereby reducing a layout length of the semiconductor structure in the second direction Y by reducing a layout length of the word line step structure 105 in the second direction Y without increasing the layout length of the semiconductor structure in the second direction Y, so as to implement proper use of layout space and reduce a total layout area of the semiconductor structure. More transistor structures 101, capacitor structures 102, and word line step structures 105 can be integrated in a unit layout area, thereby improving integration density of the semiconductor structure.

In some embodiments, referring to FIG. 4, the step structure 115 can include a support layer 163, a dielectric layer 125, and an electrical connection layer 135. The support layer 163 and the semiconductor layer 103 can be integrally formed, the dielectric layer 125 and the gate dielectric layer 131 can be integrally formed, the electrical connection layer 135 and the gate conductive layer 141 can be integrally formed, and the electrical connection layer 135 is contacted with and connected to the gate conductive layer 141.

In another embodiment, the step structure can include only the electrical connection layer, and the electrical connection layer is contacted with and connected to the gate conductive layer.

In some embodiments, referring to FIG. 2 to FIG. 4, the semiconductor structure can further include a first dielectric layer 116, a second dielectric layer 126, and a third dielectric layer 136. The first dielectric layer 116 and the second dielectric layer 126 jointly cover a sidewall of the first region 123 that extends in the first direction X, so as to implement electrical isolation between the bit line 100 and the sub-transistor structure 121. The first dielectric layer 116 and the second dielectric layer 126 also jointly cover a sidewall of the fourth region 153 that extends in the first direction X, so as to implement electrical isolation between the sub-transistor structure 121 and the sub-capacitor structure 112. The first dielectric layer 116 is further located between adjacent sub-transistor structures 121 to implement electrical isolation between the adjacent sub-transistor structures 121. The first dielectric layer 116 is further located between adjacent step structures 115 to implement electrical isolation between the adjacent step structures 115. The first dielectric layer 116 is further located between the bit line 100 and the substrate 170, so as to implement electrical isolation between the bit line 100 and the substrate 170. The second dielectric layer 126 can be further located on a side of the first dielectric layer 116 that is away from substrate 170 and on a side of the third dielectric layer 136 that is away from substrate 170. The third dielectric layer 136 is located between adjacent sub-capacitor structures 112, so as to implement electrical isolation between the adjacent sub-capacitor structures 112.

It should be noted that this embodiment of the present disclosure sets no limitation on whether the first dielectric layer 116, the second dielectric layer 126, and the third dielectric layer 136 are each a single-layer structure or a stacked structure. In practice, the first dielectric layer 116, the second dielectric layer 126, and the third dielectric layer 136 can be set according to an actual requirement.

In some embodiments, materials of the first dielectric layer 116, the second dielectric layer 126, and the third dielectric layer 136 can include at least one of an insulating material such as silicon oxide, silicon nitride, or silicon oxynitride. In an example, the material of the first dielectric layer 116 can be silicon oxide, the material of the second dielectric layer 126 can be silicon nitride, and the material of the third dielectric layer 136 can be silicon oxynitride.

In summary, the bit line 100 is in contact with a plurality of end surfaces of the bit line contact layer 104, which increases the contact area between the bit line contact layer 104 and the bit line 100, thereby reducing contact resistance between the bit line 100 and the bit line contact layer 104, and further reducing contact resistance between the bit line 100 and the transistor structure 101. In addition, the bit line contact layer 104 and the semiconductor layer 103 include the same semiconductor material, which reduces interface defects between the bit line contact layer 104 and the semiconductor layer 103, so as to improve contact performance between the bit line contact layer 104 and the semiconductor layer 103, thereby further reducing contact resistance between the bit line 100 and the transistor structure 101, and therefore, improving electrical performance of a semiconductor structure.

Another embodiment of the present disclosure further provides a semiconductor structure manufacturing method, which is used to prepare the semiconductor structure provided in the above embodiment. The following describes in detail the semiconductor structure manufacturing method provided in another embodiment of the present disclosure with reference to FIG. 1 to FIG. 11. FIG. 6 to FIG. 11 are schematic partial cross-sectional diagrams corresponding to steps of a semiconductor structure manufacturing method according to another embodiment of the present disclosure. It should be noted that the same or corresponding description similar to the above embodiment is not described herein again.

Referring to FIG. 6 to FIG. 11, a semiconductor structure manufacturing method includes: forming a transistor structure 101 and a capacitor structure 102 arranged in a first direction X, the capacitor structure 102 extending in the first direction X, both the transistor structure 101 and the capacitor structure 102 including a portion of a semiconductor layer 103, and the semiconductor layer 103 extending in the first direction X; forming a bit line contact layer 104, the bit line contact layer 104 being located on an end surface of the semiconductor layer 103 that is away from the capacitor structure 102, and the bit line contact layer 104 and the semiconductor layer 103 including the same semiconductor material; and forming a bit line 100, the bit line 100 covering an end surface of the bit line contact layer 104 that is away from the semiconductor layer 103 and covering at least a portion of a sidewall of the bit line contact layer 104 that extends in the first direction X.

In some embodiments, referring to FIG. 1, the step of forming the transistor structure 101 and the capacitor structure 102 includes: forming, in a second direction Y, a plurality of transistor structures 101 arranged at intervals and a plurality of capacitor structures 102 arranged at intervals, the bit lines 100 being in a one-to-one correspondence with the transistor structures 101, the transistor structures 101 being in a one-to-one correspondence with the capacitor structures 102, the plurality of transistor structures 101 including a partial gate structure 111, the gate structure 111 extending in the second direction Y, and the first direction X and the second direction Y being intersected.

Figure 6:
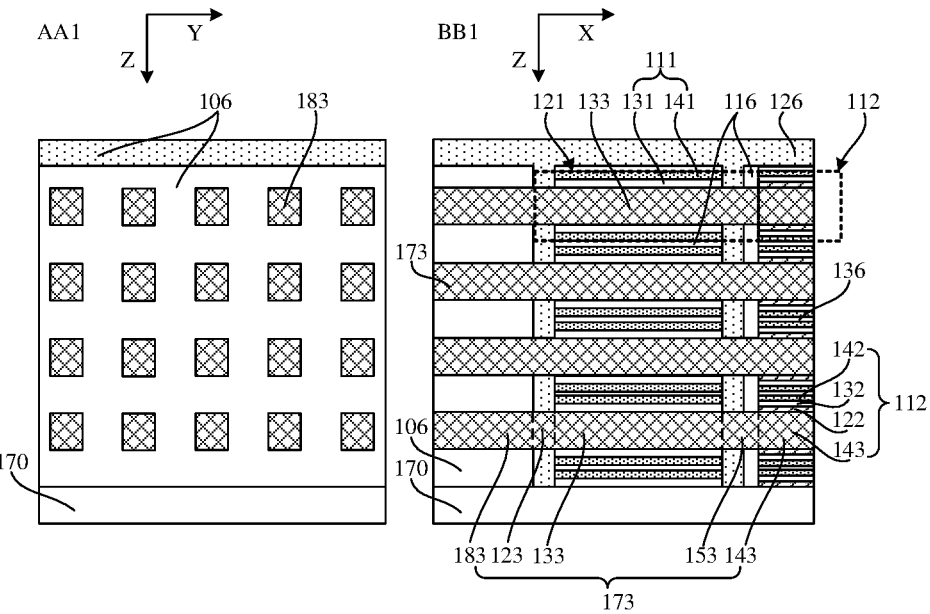
FIG. 6 to FIG. 11 are schematic partial cross-sectional diagrams corresponding to steps of a semiconductor structure manufacturing method according to another embodiment of the present disclosure.
Figure 7:
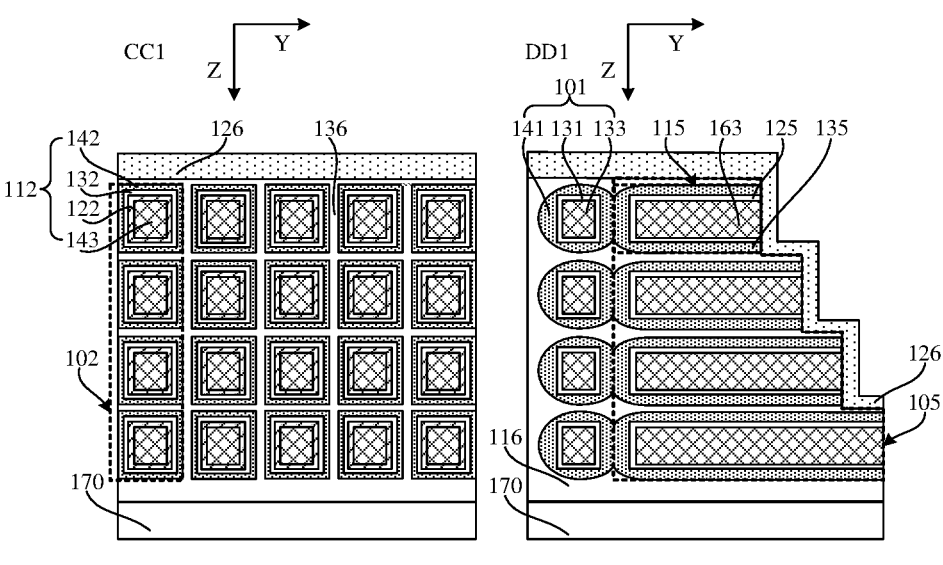

In some embodiments, referring to FIG. 6 and FIG. 7, the step of forming the transistor structure 101 and the capacitor structure 102 further includes: forming, in a third direction Z, a plurality of sub-transistor structures 121 arranged at intervals, a plurality of sub-capacitor structures 112 arranged at intervals, and a plurality of sub-semiconductor layers 113 arranged at intervals, at least some of the sub-transistor structures 121 arranged in the third direction Z constituting the transistor structure 101, at least some of the sub-capacitor structures 112 arranged in the third direction Z constituting the capacitor structure 102, and at least some of the sub-semiconductor layers 113 arranged in the third direction Z constituting the semiconductor layer 103.

As such, forming sub-transistor structures 121, sub-capacitor structures 112, and sub-semiconductor layers 113 arranged at intervals along the second direction X and/or the third direction Y improvs integration density of the transistor structure 101, the bit line 100, and the capacitor structure 102 in the semiconductor structure.

In some embodiments, still referring to FIG. 6 and FIG. 7, forming the sub-transistor structure 121 and the sub-capacitor structure 112 can include the following steps of: providing a substrate 170; sequentially stacking, on the substrate 170 in the third direction Z, a sacrificial layer 106 and a plurality of initial sub-semiconductor layers 173 arranged at intervals in the third direction Z, and in the first direction X, the initial sub-semiconductor layer 173 including a bit line region 183, a first region 123, a second region 133, and a third region 143; etching the sacrificial layer 106 facing the second region 133 to expose the second region 133 and form a gate structure 111, the gate structure 111 surrounding a sidewall of the second region 133 that extends in the first direction X; etching the sacrificial layer 106 facing the third region 143 to expose the third region 143 and form a sub-lower electrode layer 122, the sub-lower electrode layer 122 surrounding a sidewall of the third region 143 that extends in the first direction X; and sequentially stacking a capacitor dielectric layer 132 and an upper electrode layer 142 on a sidewall of the sub-lower electrode layer 122 that extends in the first direction X; where the first region 123, the second region 133, and the gate structure 111 constitute the sub-transistor structure 121, and the third region 143, the sub-lower electrode layer 122, the capacitor dielectric layer 132, and the upper electrode layer 142 constitute the sub-capacitor structure 112.

It should be noted that in another embodiment of the present disclosure, a specific formation method and a formation sequence of the sub-transistor structure 121 and the sub-capacitor structure 112 are not so limited. In addition, after the sub-transistor structure 121 and the sub-capacitor structure 112 are formed, a portion of a first dielectric layer 116, a portion of a second dielectric layer 126, and a third dielectric layer 136 are formed, and a remaining portion of the sacrificial layer 106 facing the bit line region 183 is subsequently etched to form the first dielectric layer 116 and the second dielectric layer 126. Specific descriptions of the first dielectric layer 116, the second dielectric layer 126, and the third dielectric layer 136 can be referred to the above embodiment, and details are omitted herein for simplicity. In addition, details about the sub-transistor structure 121 and the sub-capacitor structure 112 can be referred to the above embodiment. Details are omitted herein for simplicity again.

It can be understood that the sacrificial layer 106 facing the second region 133 refers to a portion of the sacrificial layer 106 in which an orthographic projection of the sacrificial layer 106 on the substrate 170 overlaps an orthographic projection of the second region 133 on the substrate 170. The sacrificial layer 106 facing the third region 143 refers to a portion of the sacrificial layer 106 in which an orthographic projection of the sacrificial layer 106 on the substrate 170 overlaps an orthographic projection of the third region 143 on the substrate 170.

In some embodiments, referring to FIG. 1 and FIG. 7, in the second direction Y, some of the sub-transistor structures 121 in different transistor structures 101 can include a partial region of the same gate structure 111. The gate structure 111 extends in the second direction Y. The quantity of the sub-transistor structures 121 in the same transistor structure 101 is the same as the quantity of the gate structures 111, and any two of the first direction X, the second direction Y, and the third direction Z are intersected. The manufacturing method can further include: forming a word line step structure 105. The word line step structure 105 is electrically connected to the plurality of gate structures 111.

It should be noted that a specific method for forming the word line step structure 105 is not limited in another embodiment of the present disclosure. In addition, the specific description of the word line step structure 105 can be referred to the above embodiment. Details are omitted herein for simplicity again.

The following describes in detail how to form the bit line 100 and the bit line contact layer 104 by using example embodiments.

Figure 8:
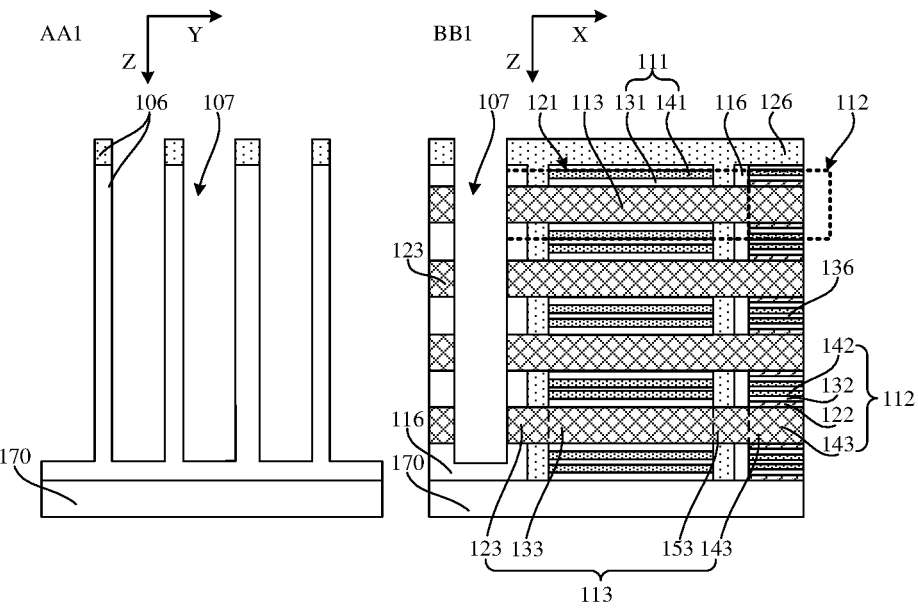

In some embodiments, forming the bit line contact layer 104 and the bit line 100 can include the following steps: with reference to FIG. 6 and FIG. 8, etching the bit line region 183 and the sacrificial layer 106 facing the bit line region 183 to form a first groove 107 and the semiconductor layer 103 (refer to FIG. 3), the semiconductor layer 103 including a plurality of sub-semiconductor layers 113 arranged at intervals in the third direction Z, the sub-semiconductor layer 113 including the first region 123, the second region 133, and the third region 143 in the first direction X, and the first groove 107 exposing an end surface of the first region 123 that is away from the second region 133.

It can be understood that the sacrificial layer 106 facing the bit line region 183 refers to a portion of the sacrificial layer 106 in which an orthographic projection of the sacrificial layer 106 on the substrate 170 overlaps an orthographic projection of the bit line region 183 on the substrate 170. The first groove 107 is configured to subsequently form the bit line contact layer 104 and the bit line 100.

Figure 9:
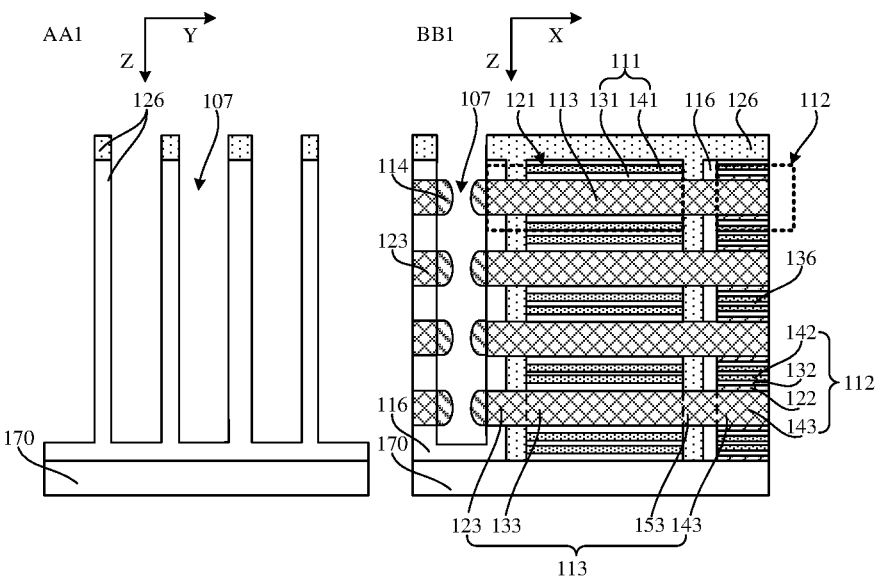

Referring to FIG. 9, the raised layer 114 is formed on the end surface exposed in the first region 123, the raised layer 114 is located in the first groove 107, and the raised layer 114 and the sub-semiconductor layer 113 include the same semiconductor material. In an example, both the material of the raised layer 114 and the material of the sub-semiconductor layer 113 include a silicon material.

In some embodiments, the step of forming the raised layer 114 can include: forming the raised layer 114 on the end surface exposed in the first region 123 by using an epitaxial growth process.

It can be understood that the epitaxial growth process improves continuity between the raised layer 114 and the first region 123, reduce contact defects caused by different lattice characteristics or lattice misplacement, reduce contact resistance caused by the contact defects, improve a carrier transmission capability and moving speed, improve conductive performance between the raised layer 114 and the first region 123, and improve conductive performance between the bit line contact layer 104 formed based on the raised layer 114 and the first region 123, and reduce heating in a semiconductor structure operation process.

With reference to FIG. 9 and FIG. 2, the raised layer 114 is metallized to form the bit line contact layer 104.

In some embodiments, the step of performing metallization on the raised layer 114 can include: forming a metal layer (not shown in the figure) on a surface of the raised layer 114 exposed by the first groove 107, the metal layer providing a metal element for subsequent formation of the bit line contact layer 104, and the metal layer being further located on a surface of the remaining first groove 107; performing annealing processing to convert the raised layer 114 into the bit line contact layer 104; and after the bit line contact layer 104 is formed, removing the remaining metal layer. A material of the metal layer can include at least one of cobalt, nickel, molybdenum, titanium, tungsten, tantalum, or platinum.

It should be noted that, in FIG. 2, for example, only the raised layer 114 is converted to the bit line contact layer 104. In some embodiments, in addition to converting the raised layer 114 into the bit line contact layer 104, a partial region of the second region 133 that is contacted with and connected to the raised layer 114 can also be converted into a portion of the bit line contact layer 104. Or in some other embodiments, only a portion of the raised layer 114 is converted into the bit line contact layer 104.

It can be understood that, an end surface of the raised layer 114 that is away from the first region 123 and at least a portion of the sidewall of the raised layer 114 are exposed in the first groove 107. As such, it is helpful to increase a surface area of the raised layer 114 that is subjected to metallization processing, so as to increase a diffusion path of a metal element to the raised layer 114 and the first region 123 in a metallization processing process, thereby improving a metallization processing effect, and improving conductivity of the final bit line contact layer 104. In addition, the bit line contact layer 104 is at least partially located in the first groove 107. When the bit line 100 is formed in the remaining first groove 107, it is advantageous to make the bit line 100 cover the end surface of the bit line contact layer 104 that is away from the first region 123 and at least a portion of the sidewall of the bit line contact layer 104 that extends along the first direction X. As such, it increases the contact area between the bit line contact layer 104 and the bit line 100, thereby reducing contact resistance between the bit line 100 and the bit line contact layer 104, and further reducing contact resistance between the bit line 100 and the transistor structure 101.

With reference to FIG. 9 and FIG. 2, the bit line 100 is formed, and the bit line 100 fills the remaining first groove 107.

In some other embodiments, forming the bit line contact layer 104 and the bit line 100 can include the following steps: with reference to FIG. 6 and FIG. 8, etching the bit line region 183 and the sacrificial layer 106 facing the bit line region 183 to form a first groove 107 and the semiconductor layer 103 (refer to FIG. 3), the semiconductor layer 103 including a plurality of sub-semiconductor layers 113 arranged at intervals in the third direction Z, the sub-semiconductor layer 113 including the first region 123, the second region 133, and the third region 143 in the first direction X, and the first groove 107 exposing an end surface of the first region 123 that is away from the second region 133.

It can be understood that the sacrificial layer 106 facing the bit line region 183 refers to a portion of the sacrificial layer 106 in which an orthographic projection of the sacrificial layer 106 on the substrate 170 overlaps an orthographic projection of the bit line region 183 on the substrate 170. The first groove 107 is configured to subsequently form the bit line contact layer 104 and the bit line 100.

Figure 10:
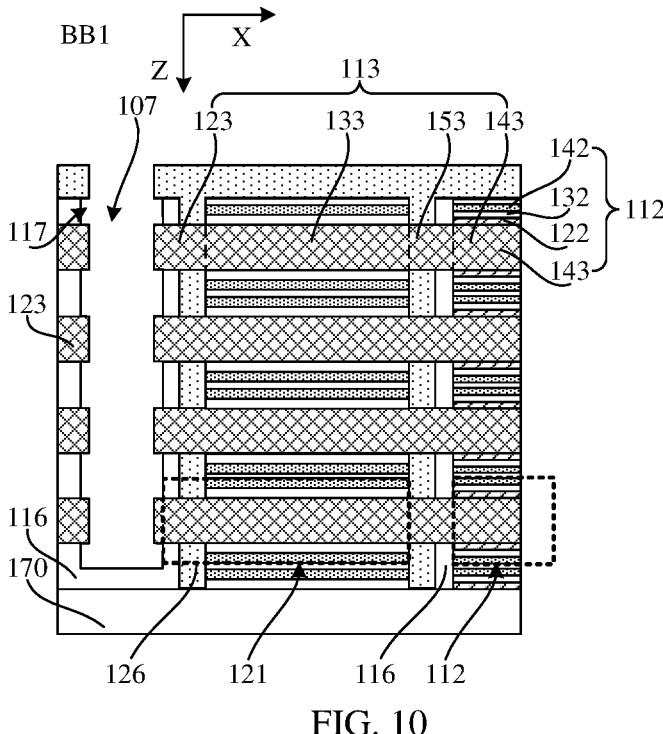

With reference to FIG. 8 and FIG. 10, the sacrificial layer 106 exposed by the first groove 107 is etched to form a second groove 117, the second groove 117 exposing a portion of a sidewall of the first region 123 that extends in the first direction X, and the first groove 107 communicating with the second groove 117.

As such, exposing, by using both the first groove 107 and the second groove 117, the end surface of the first region 123 that is away from the second region 133 and a portion of the sidewall of the first region 123 that extends along the first direction X increases a surface area on which the first region 123 can be metallized subsequently, thereby increasing a diffusion path of a metal element to the first region 123 in the metallization processing process, improving a metallization processing effect, and improving conductivity of the bit line contact layer 104.

Figure 11:
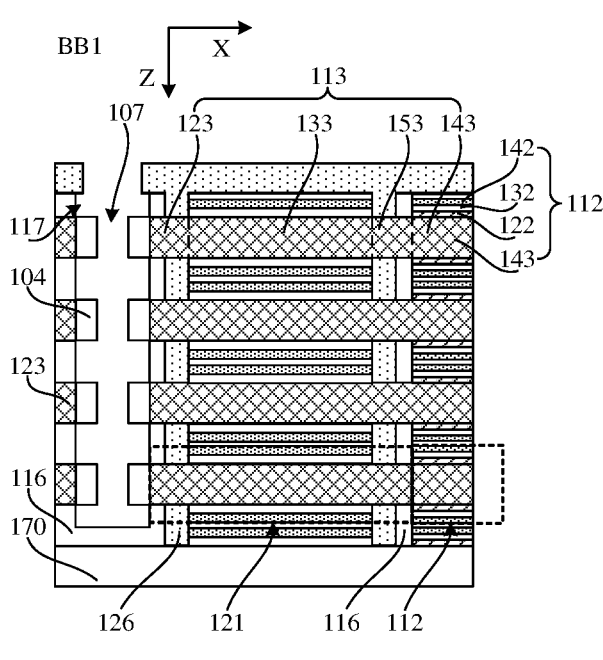

Referring to FIG. 11, the first region 123 exposed by the first groove 107 and the second groove 117 is metallized to form the bit line contact layer 104, the bit line contact layer 104 being at least in the first groove 107.

In some embodiments, the step of performing metallization processing on the first region 123 can include: forming a metal layer (not shown in the figure) on a surface of the first region 123 exposed by the first groove 107 and the second groove 117, the metal layer providing a metal element for subsequently formation of the bit line contact layer 104, and the metal layer being further located on the surface of the remaining first groove 107 and the remaining second groove 117; performing annealing processing to convert a portion of the first region 123 into the bit line contact layer 104; and after the bit line contact layer 104 is formed, removing the remaining metal layer. A material of the metal layer can include at least one of cobalt, nickel, molybdenum, titanium, tungsten, tantalum, or platinum.

It should be noted that, in FIG. 3, for example, only the first region 123 exposed jointly by the first groove 107 and the second groove 117 is converted into the bit line contact layer 104. In some embodiments, in addition to converting the first region 123 jointly exposed by the first groove 107 and the second groove 117 into the bit line contact layer 104, a portion of the second region 133 that is not exposed by the second groove 117 can also be converted into a portion of the bit line contact layer 104. Or in some other embodiments, only a portion of the first region 123 exposed jointly by the first groove 107 and the second groove 117 is converted into the bit line contact layer 104.

In addition, the formed bit line contact layer 104 is at least partially located in the first groove 107. When the bit line 100 is formed in the remaining first groove 107 and the remaining second groove 117, it is advantageous to make the bit line 100 cover the end surface of the bit line contact layer 104 that is away from the first region 123 and at least a portion of the sidewall of the bit line contact layer 104 that extends along the first direction X. As such, it increases the contact area between the bit line contact layer 104 and the bit line 100, thereby reducing contact resistance between the bit line 100 and the bit line contact layer 104, and further reducing contact resistance between the bit line 100 and the transistor structure 101.

With reference to FIG. 11 and FIG. 3, the bit line 100 is formed, and the bit line 100 fills the remaining first groove 107 and the remaining second groove 117.

In the above embodiments, referring to FIG. 2 and FIG. 3, the step of forming the bit line 100 can further include: forming a diffusion barrier layer 130, the diffusion barrier layer 130 conformally covering a surface exposed by the bit line contact layer 104, and the diffusion barrier layer 130 surrounding a third groove; and forming a conductive layer 140, the conductive layer 140 filling the third groove. The diffusion barrier layer 130 prevents diffusion of a conductive material in the conductive layer 140 to the bit line contact layer 104, so as to ensure good conductive performance of the bit line contact layer 104.

In some embodiments, referring to FIG. 2, the diffusion barrier layer 130 conformally covers the surface of the bit line contact layer 104 exposed by the first groove 107 and the surface of the remaining first groove 107. In some other embodiments, referring to FIG. 3, the diffusion barrier layer 130 conformally covers a surface of the bit line contact layer 104 jointly exposed by the first groove 107 and the second groove 117, and a surface of the remaining first groove 107 and a surface of the remaining second groove 117.

In summary, in the semiconductor structure formed by using the above manufacturing method, the bit line 100 is in contact with a plurality of end surfaces of the bit line contact layer 104, which increases the contact area between the bit line contact layer 104 and the bit line 100, thereby reducing contact resistance between the bit line 100 and the bit line contact layer 104, and further reducing contact resistance between the bit line 100 and the transistor structure 101. In addition, the bit line contact layer 104 and the semiconductor layer 103 include the same semiconductor material, which reduces interface defects between the bit line contact layer 104 and the semiconductor layer 103, so as to improve contact performance between the bit line contact layer 104 and the semiconductor layer 103, thereby further reducing contact resistance between the bit line 100 and the transistor structure 101, and therefore, improving electrical performance of a semiconductor structure.

A person of ordinary skill in the art can understand that the above embodiments are specific embodiments of the present disclosure. In practice, various form and detail changes can be made to the embodiments of the present disclosure without departing from the spirit and scope of the embodiments of the present disclosure. Any person skilled in the art can make changes and modifications without departing from the spirit and scope of the embodiments of the present disclosure. Therefore, the protection scope of the embodiments of the present disclosure shall be limited to the scope of the claims.

What is claimed is:

1. A semiconductor structure, comprising:
    a bit line, a transistor structure, and a capacitor structure arranged in sequence in a first direction, the capacitor structure extending in the first direction, both the transistor structure and the capacitor structure including a portion of a semiconductor layer, and the semiconductor layer extending in the first direction; and
    a bit line contact layer formed separately from the semiconductor layer or the bit line by an epitaxial growth process on an end surface of the semiconductor layer that is away from the capacitor structure, the bit line contact layer and the semiconductor layer including a same semiconductor material, the bit line contact layer comprising an end surface that is away from the semiconductor layer and extends in a direction perpendicular to the first direction and a sidewall that extends in the first direction, and the bit line covering the end surface of the bit line contact layer that is away from the semiconductor layer and covering at least a portion of the sidewall of the bit line contact layer that extends in the first direction.

2. The semiconductor structure according to claim 1, wherein the bit line has at least one recessed region recessing inward the bit line covering at least the portion of the sidewall of the bit line contact layer that extends in the first direction.

3. The semiconductor structure according to claim 1, wherein material of the bit line contact layer is a metal-semiconductor material.

4. The semiconductor structure according to claim 1, wherein the bit line includes a diffusion barrier layer and a conductive layer that are sequentially stacked.

5. The semiconductor structure according to claim 1, wherein a plurality of bit lines, a plurality of transistor structures, and a plurality of capacitor structures are arranged in a second direction, the bit lines are in a one-to-one correspondence with the transistor structures, the transistor structures are in a one-to-one correspondence with the capacitor structures, the plurality of transistor structures include a partial gate structure, the gate structure extends in the second direction, and the first direction and the second direction are intersected.

6. The semiconductor structure according to claim 5, wherein the transistor structure includes a plurality of sub-transistor structures arranged at intervals in a third direction, the capacitor structure includes a plurality of sub-capacitor structures arranged at intervals in the third direction, the semiconductor layer includes a plurality of sub-semiconductor layers arranged at intervals in the third direction, the sub-transistor structures are in a one-to-one correspondence with the sub-capacitor structures, and all the sub-transistor structures and the corresponding sub-capacitor structures include a portion of the sub-semiconductor layer; and in addition, the bit line extends in the third direction, the bit line is electrically connected to a plurality of sub-transistor structures in the same transistor structure, and the sub-transistor structures are in a one-to-one correspondence with the bit line contact layers.

7. The semiconductor structure according to claim 6, wherein in the first direction, the bit line includes opposite first and second sides, and the first and second sides are electrically connected to different transistor structures.

8. The semiconductor structure according to claim 6, wherein in the first direction, the sub-semiconductor layer includes a first region, a second region, and a third region, and an end surface of the first region that is away from the second region is in contact with the bit line contact layer; the sub-transistor structure includes the first region, the second region, and a gate structure, and the gate structure surrounds a sidewall of the second region that extends in the first direction; the sub-capacitor structure includes the third region, and a sub-lower electrode layer, a capacitor dielectric layer, and an upper electrode layer that are sequentially stacked, and the sub-lower electrode layer surrounds a sidewall of the third region that extends in the first direction.

9. The semiconductor structure according to claim 6, wherein in the second direction, some of the sub-transistor structures in different transistor structures include a partial region of a same gate structure, the gate structure extends in the second direction, a quantity of the sub-transistor structures in the same transistor structure is the same as a quantity of the gate structures, and any two of the first direction, the second direction, and the third direction are intersected; and the semiconductor structure further comprises a word line step structure, electrically connected to the plurality of gate structures.

10. The semiconductor structure according to claim 9, wherein the word line step structure includes a plurality of step structures arranged at intervals in the third direction, the step structures extend in the second direction, lengths of the step structures in the second direction are different, and the step structures are in a one-to-one correspondence with the gate structures.

11. A semiconductor structure manufacturing method, comprising:

forming a transistor structure and a capacitor structure arranged in a first direction, the capacitor structure extending in the first direction, both the transistor structure and the capacitor structure including a portion of a semiconductor layer, and the semiconductor layer extending in the first direction;

forming a bit line contact layer separately from the semiconductor layer or the bit line by an epitaxial growth process on an end surface of the semiconductor layer that is away from the capacitor structure, the bit line contact layer and the semiconductor layer including a same semiconductor material, and the bit line contact layer comprising an end surface that is away from the semiconductor layer and extends in a direction perpendicular to the first direction and a sidewall that extends in the first direction; and forming a bit line, the bit line, the transistor structure, and the capacitor structure arranged in sequence in the first direction, the bit line covering the end surface of the bit line contact layer that is away from the semiconductor layer and covering at least a portion of the sidewall of the bit line contact layer that extends in the first direction.

12. The manufacturing method according to claim 11, wherein the step of forming the transistor structure and the capacitor structure includes:

forming, in a second direction, a plurality of transistor structures arranged at intervals and a plurality of capacitor structures arranged at intervals, the bit lines being in a one-to-one correspondence with the transistor structures, the transistor structures being in a one-to-one correspondence with the capacitor structures, the plurality of transistor structures including a partial gate structure, the gate structure extending in the second direction, and the first direction and the second direction being intersected.

13. The manufacturing method according to claim 11, wherein the step of forming the transistor structure and the capacitor structure further includes:

forming, in a third direction, a plurality of sub-transistor structures arranged at intervals, a plurality of sub-capacitor structures arranged at intervals, and a plurality of sub-semiconductor layers arranged at intervals, at least some of the sub-transistor structures arranged in the third direction constituting the transistor structure, at least some of the sub-capacitor structures arranged in the third direction constituting the capacitor structure, and at least some of the sub-semiconductor layers arranged in the third direction constituting the semiconductor layer.

14. The manufacturing method according to claim 13, wherein the step of forming the sub-transistor structure and the sub-capacitor structure includes:

providing a substrate;

sequentially stacking, on the substrate in the third direction, a sacrificial layer and a plurality of initial sub-semiconductor layers arranged at intervals in the third direction, and in the first direction, the initial sub-semiconductor layer including a bit line region, a first region, a second region, and a third region;

etching the sacrificial layer facing the second region to expose the second region and form a gate structure, the gate structure surrounding a sidewall of the second region that extends in the first direction;

etching the sacrificial layer facing the third region to expose the third region and form a sub-lower electrode layer, the sub-lower electrode layer surrounding a sidewall of the third region that extends in the first direction; and sequentially stacking a capacitor dielectric layer and an upper electrode layer on a sidewall of the sub-lower electrode layer that extends in the first direction;

wherein the first region, the second region, and the gate structure constitute the sub-transistor structure, and the third region, the sub-lower electrode layer, the capacitor dielectric layer, and the upper electrode layer constitute the sub-capacitor structure.

15. The manufacturing method according to claim 14, wherein the step of forming the bit line contact layer and the bit line includes:

etching the bit line region and the sacrificial layer facing the bit line region to form a first groove and the semiconductor layer, the semiconductor layer including a plurality of sub-semiconductor layers arranged at intervals in the third direction, the sub-semiconductor layer including the first region, the second region, and the third region in the first direction, and the first groove exposing an end surface of the first region that is away from the second region;

forming a raised layer on the end surface exposed in the first region, the raised layer being located in the first groove, and the raised layer and the sub-semiconductor layer including a same semiconductor material;

performing metallization processing on the raised layer to form the bit line contact layer; and forming the bit line, the bit line filling the remaining first groove.

16. The manufacturing method according to claim 15, wherein the step of forming the raised layer includes: forming the raised layer on the end surface exposed in the first region by using the epitaxial growth process.

17. The manufacturing method according to claim 14, wherein the step of forming the bit line contact layer and the bit line includes:

etching the bit line region and the sacrificial layer facing the bit line region to form a first groove and the semiconductor layer, the semiconductor layer including a plurality of sub-semiconductor layers arranged at intervals in the third direction, the sub-semiconductor layer including the first region, the second region, and the third region in the first direction, and the first groove exposing an end surface of the first region that is away from the second region;

etching the sacrificial layer exposed by the first groove to form a second groove, the second groove exposing a portion of a sidewall of the first region that extends in the first direction, and the first groove communicating with the second groove;

performing metallization processing on the first region exposed by the first groove and the second groove to form the bit line contact layer, the bit line contact layer being at least in the first groove; and forming the bit line, the bit line filling the remaining first groove and the remaining second groove.

18. The manufacturing method according to claim 15, wherein the step of forming the bit line further includes:

forming a diffusion barrier layer, the diffusion barrier layer conformally covering a surface exposed by the bit line contact layer, and the diffusion barrier layer surrounding a third groove; and forming a conductive layer, the conductive layer filling the third groove.

* * * * *